United States Patent [19]

Nakaso et al.

[11] Patent Number: 5,254,156

[45] Date of Patent: Oct. 19, 1993

[54] AQUEOUS SOLUTION FOR ACTIVATION ACCELERATING TREATMENT

[75] Inventors: Akishi Nakaso, Oyama; Kaoru Oginuma, Mito; Takeshi Shimazaki, Hitachi; Akio Takahashi, Shimodate, all of Japan

[73] Assignee: Hitachi Chemical Company, Ltd., Tokyo, Japan

[21] Appl. No.: 978,405

[22] Filed: Nov. 18, 1992

Related U.S. Application Data

[62] Division of Ser. No. 518,500, May 2, 1990, Pat. No. 5,206,052.

[30] Foreign Application Priority Data

May 9, 1989 [JP] Japan .................................. 1-115834

[51] Int. Cl.$^5$ .............................................. C23C 18/18
[52] U.S. Cl. ................................................... 106/1.11
[58] Field of Search ............................... 106/1.05, 1.11

[56] References Cited

U.S. PATENT DOCUMENTS

| | | | |
|---|---|---|---|
| 3,772,056 | 11/1973 | Polichette et al. | 106/1.26 |
| 4,181,750 | 1/1980 | Beckenbaugh et al. | 106/1.11 |
| 4,182,784 | 1/1980 | Krulik | 106/1.11 |
| 4,199,623 | 4/1980 | Nuzzi et al. | 106/1.11 |
| 4,293,592 | 10/1981 | Morishita et al. | 427/98 |
| 4,448,804 | 5/1984 | Amelio et al. | 427/98 |
| 4,450,190 | 5/1984 | Nuzzi et al. | 106/1.11 |
| 4,540,464 | 9/1985 | Mueller et al. | 427/97 |
| 4,666,739 | 5/1987 | Roubal | 427/97 |
| 4,863,758 | 9/1989 | Rhodenizer | 106/1.11 |

FOREIGN PATENT DOCUMENTS

| | | |
|---|---|---|
| 0139233 | 5/1985 | European Pat. Off. . |
| 050690 | 4/1980 | Japan ........................ 427/98 |
| 8500387 | 1/1985 | PCT Int'l Appl. . |
| 488484 | 4/1983 | U.S.S.R. ................... 427/97 |

OTHER PUBLICATIONS

Grant & Hackh's Chemical Dictionary, 5th Ed. 1988, p. 563.

Primary Examiner—Helene Klemanski
Attorney, Agent, or Firm—Antonelli, Terry, Stout & Kraus

[57] ABSTRACT

An aqueous solution comprising sulfuric acid, cupric chloride and, if necessary, an organic acid is effective as an activation accelerating treatment for electroless palting for improving electroless plating in through-holes and for improving adhesive strength between a copper foil and an electrolessly plated copper.

3 Claims, No Drawings

AQUEOUS SOLUTION FOR ACTIVATION ACCELERATING TREATMENT

This application is a division application of application Ser. No. 518,500, filed May 2, 1990, now U.S. Pat. No. 5,206,052.

BACKGROUND OF THE INVENTION

This invention relates to a process for carrying out electroless plating.

Electroless plating on insulating materials such as glass and plastics is usually carried out by subjecting an insulating material to be plated to a conditioning treatment for improving an adsorbing power of a catalyst for electroless plating on the surface of insulating material, contacting the insulating material with a catalyst solution for electroless plating such as an aqueous solution containing palladium chloride and stannous chloride to adsorb the catalyst for electroless plating on the insulating material surface, subjecting the resulting insulating material to a treatment for accelerating the activity of catalyst for electroless plating, followed by dipping in an electroless plating solution.

Heretofore, the activation accelerating treatment has been conducted, for example, by dipping in a treating solution containing a mixed acid of sulfuric acid and hydrochloric acid, or such a mixed acid and tartaric acid (Japanese Patent Unexamined Publication No. 50-81927), or by dipping in an aqueous solution containing NaOH and ethylenediaminetetraacetic acid (Japanese Patent Unexamined Publication No. 51-8127).

In the production of printed wiring boards today, electroless plating is an important technique for forming through-holes which connect circuit patterns separated by an insulating material. As the insulating material which is required to have high reliability used in printed wiring boards, there are used insulating resins reinforced with inorganic oxide fibers such as glass fibers. In order to form through-hole circuit connection in such insulating materials, it is necessary to provide electroless plating sufficiently on both the insulating resin and the inorganic oxide fiber exposed on inner walls of drilled through-holes. If the deposition of electroless plating on either one of them is insufficient, there are formed so-called pin-holes which are non-metallized portions and are retained even if a metal layer in a through-hole is thickened by electric plating after the electroless plating. Thus, molten solder used for mounting electronic parts on the printed wiring board does not contact with the metal layer in the through-hole sufficiently, which results in making electrical connection between the electronic parts and the circuit insufficient.

According to the prior art processes of dipping in a treating solution containing a mixed acid of sulfuric acid and hydrochloric acid or a mixture of mixed acid and tartaric acid, or an aqueous solution containing NaOH and ethylenediaminetetraacetic acid for activation accelerating treatment, there was a problem in that activation acceleration for both the insulating resin and the inorganic oxide fiber was insufficient.

Further, in the production of printed wiring boards, it is necessary to conduct electroless plating not only on the two kinds of materials of insulating resin and inorganic oxide fiber, but also on a metal constituting circuits for electrical connection between circuits. But peeling of the metal by thermal shock easily takes place, so that it is necessary to give good adhesive strength between the metal constituting this circuit and the metal deposited by electroless plating. According to the known activation accelerating treatments, the adhesive strength between the copper foil and the electrolessly plated film is sometimes lowered.

SUMMARY OF THE INVENTION

It is an object of the present invention to provide a process for carrying out electroless plating good in deposition of a metal by electroless plating in through-holes and high in adhesive strength between a copper foil and the electrolessly plated metal.

The present invention provides a process for carrying out electroless plating which comprises
conditioning a surface of a material to be plated,
contacting the resulting material with an aqueous catalyst solution for electroless plating,
subjecting the resulting material to activation accelerating treatment, and
carrying out electroless plating,
the material to be placed comprising an insulating material and a metal layer or foil adhered thereto, and said activation accelerating treatment being carried out using an aqueous solution comprising sulfuric acid, cupric chloride, and, if necessary, an organic acid.

DESCRIPTION OF THE PREFERRED EMBODIMENTS

In the present invention, the material to be plated comprises an insulating material and a metal layer or a metal foil adhered thereto. Concrete examples of such a material are copper-clad laminates used for printing wiring boards, articles made from plastics (organic resins) having a metal foil on the surface thereof for decoration, etc. According to the present invention, good electrical connection can be attained particularly on inner walls of through-holes by conducting electroless plating on an insulating plate having a metal foil thereon or therein (e.g. through-holes in a copper-clad laminate usually used for printed wiring boards or a laminate having inner circuits obtained by etching therein, etc.), or metallic layers for decoration can be formed on cross-sections or hole surfaces of articles made from plastics (resins) and covered with metal foils.

As the insulating material, there can be used thermosetting resins such as epoxy resins, phenol resins, polyester resins, polyimide resins, etc.; thermoplastic resins such as polyethylenes, nylons, polytetrafluoroethylenes etc.; combinations of these resins or polymers with reinforcing fibers such as glass fibers, glass cloth, paper, carbon fibers, etc.; these insulating materials mixed with inorganic fillers such as silica, talc, titanium white, glass short fibers, etc.

As the metal foil, there can be used foils of copper, aluminum, nickel, alloys of these metals, and these foils can be plated with gold, palladium, nickel, platinum, titanium, etc.

The conditioning of the surface of the material to plated can be carried out by a conventional method.

As the aqueous catalyst solution for electroless plating, there can be used, for example, that containing a palladium salt such as palladium chloride and a tin salt such as stannous chloride.

The aqueous solution used for activation accelerating treatment comprises sulfuric acid and cupric chloride, and if necessary an organic acid.

The concentration of sulfuric acid is preferably 0.01 to 5 mole/l., more preferably 0.1 to 2 mole/l. The concentration of cupric chloride is preferably 0.00003 to 0.03 mole/l., more preferably 0.0001 to 0.005 mole/l. The concentration of cupric chloride controls adhesive strength between a copper foil on the material to be plated and electrolessly plated copper and the life of activation accelerating treating solution. When the concentration is less than 0.00003 mole/l., the adhesive strength between the copper foil and the electrolessly plated copper is lowered, while when the concentration is more than 0.03 mole/l., the life of the activation accelerating treating solution is lowered.

When an organic acid is added to the activation accelerating treating solution, deposition of electrolessly deposited metal such as copper on inner walls of through-holes can further be bettered.

Examples of the organic acid are citric acid, glyceric acid, malonic acid, malic acid, glycolic acid, lactic acid, tartaric acid, adipic acid, etc. These organic acids can be used alone or as a mixture thereof.

The concentration of the organic acid is preferably 5 mole/l. or less, more preferably 0.005 to 3 mole/l.

The electroless plating can be carried out by a conventional method.

Preferable electroless copper plating bath comprises copper ions, a complexing agent for copper ions such as Rochell salts., a reducing agent for copper ions such as formaldehyde, a pH regulator such as NaOH and other additives such as a stabilizer for the plating bath. Copper ions are usually used in an amount of 5 to 30 g/liter converted to the amount of copper sulfate. The complexing agent or copper ions is used in an amount necessary for completely complexing the copper ions, usually in an amount of 1.2 equivalent weight or more per equivalent weight of the copper ions, when the electroless palting is carried out continuously. The use of more than 2 equivalent weight of complexing agent is disadvantageous economically. The pH regulator is used so as to make the pH of the plating bath 8 or higher, preferably 9 to 13.

Preferable electroless nickel plating bath comprises nickel ions, a complexing agent for nickel ions, a reducing agent for nickel ions, and other additives, these being used conventionally.

According to the present invention, an electrolessly plated metal (Cu, Ni, etc.) layer can be formed on exposed insulating material portions including insulating resins and inorganic fibers such as glass fibers and exposed metal layer or foil portions with strong bonding strength. Therefore, the present invention is particularly effective for electrolessly plating through-holes of printed circuit boards wherein an insulating material containing an insulating resin and an inorganic fibers, and a metal layer or foil used for forming circuits are exposed on inner walls of through-holes, thereby forming a metal layer by electroless plating for the through-hole connection.

As mentioned above, by using the special activation accelerating treating solution, the electroless plating in through-holes can be carried out very well and high adhesive strength can be obtained between the metal (e.g. Cu) foil as well as the material to be plated and the electrolessly plated metal such as copper.

The present invention is illustrated by way of the following Examples.

EXAMPLE 1

A glass fiber reinforced epoxy resin laminate (MCL E-67, a trade name mfd. by Hitachi Chemical Co., Ltd.) having through-holes of 0.9 mm in diameter was dipped in an aqueous solution of ammonium peroxosulfate (100 g/l.) for 2 minutes, washed with water for 3 minutes, and dipped in the following conditioner for accelerating adsorption of electroless plating catalyst at 50° C. for 5 minutes;

Cationic surface active agent 1 g/l.
Amphoteric surface active agent 10 g/l.

Then, the thus treated laminate was washed with water for 3 minutes and dipped in the following catalyst solution for 10 minutes:

| Palladium chloride | 0.3 g/l. |
|---|---|
| Stannous chloride | 18.0 g/l. |
| HCl | 60 ml/l. |

The thus treated laminate was washed with water for 5 minutes.

The resulting substrate was dipped in an aqueous solution containing 0.5 mole/l of sulfuric acid and 0.0003 mole/l. of cupric chloride for 5 minutes, washed with water for 5 minutes, and dipped in the following electroless copper plating bath for 15 minutes to carry out electroless copper plating:

| $CuSO_4.5H_2O$ | 15 g/l. |
|---|---|
| Rochelle salt | 25 g/l. |
| Formalin (37%) | 20 ml/l. |
| NaOH for making pH | 12.45 |
| Stabilizer | a trace amount |

EXAMPLE 2

The process of Example 1 was repeated except for using as the activation accelerating treating solution an aqueous solution containing 0.5 mole/l. of sulfuric acid, 0.0006 mole/l. of cupric chloride and 0.05 mole/l. of citric acid.

EXAMPLE 3

The process of Example 1 was repeated except for using as the activation accelerating treating solution an aqueous solution containing 1.0 mole/l. of sulfuric acid, 0.0001 mole/l. of cupric chloride and 2.0 mole/l. of glyceric acid.

EXAMPLE 4

The process of Example 1 was repeated except for using as the activation accelerating treating solution an aqueous solution containing 0.5 mole/l. of sulfuric acid, 0.0003 mole/l of cupric chloride and 0.1 mole/l. of malonic acid.

EXAMPLE 5

The process of Example 1 was repeated except for using as the activation accelerating treating solution an aqueous solution containing 0.5 mole/l. of sulfuric acid, 0.0003 mole/l. of cupric chloride and 0.02 mole/l. of adipic acid.

EXAMPLE 6

The process of Example 1 was repeated except for using as the activation accelerating treating solution an aqueous solution containing 0.5 mole/l. of sulfuric acid, 0.0003 mole/l. of cupric chloride and 0.1 mole/l. of malic acid.

EXAMPLE 7

The process of Example 1 was repeated except for using as the activation accelerating treating solution an aqueous solution containing 0.5 mole/l. of sulfuric acid, 0.0003 mole/l. of cupric chloride and 0.1 mole/l. of lactic acid.

EXAMPLE 8

The process of Example 1 was repeated except for using as the activation accelerating treating solution an aqueous solution containing 0.5 mole/l. of sulfuric acid, 0.0003 mole/l. of cupric chloride and 0.05 mole/l. of glycolic acid.

EXAMPLE 9

The process of Example 1 was repeated except for using as the activation accelerating treating solution an aqueous solution containing 0.5 mole/l. of sulfuric acid, 0.0003 mole/l. of cupric chloride and 0.05 mole/l. of tartaric acid.

The plating states of inner walls of through-holes of the thus electrolessly plated substrates were observed by using an optical microscope. As a result, it was found that surfaces of the glass fibers and surfaces of the epoxy resin of the inner walls were well plated electrolessly.

Further, these substrates plated electrolessly were dipped in an aqueous solution of copper sulfate usually used for electric plating conventionally used for printed wiring boards to carry out electric plating until a deposited metal layer became 40 μm. Then, the resulting substrates were subjected to a peeling test to examine adhesive strength between the copper foil and the electrolessly plated copper. There was no peeling between the copper foil and the electrolessly plated copper at the interface, but peeling took place between the copper foil and the insulating substrate. This shows that the adhesive strength between the copper foil and the electrolessly plated copper is high.

As mentioned above, according to the present invention, there can be obtained good electroless plating in through-holes, and the adhesive strength between the copper foil and the electrolessly plated copper is high.

What is claimed is:

1. An aqueous solution for activation accelerating treatment prior to electroless plating consisting of water, sulfuric acid in a concentration of 0.01 to 5 mole/liter and cupric chloride in a concentration of 0.00003 to 0.03 mole/liter.

2. An aqueous solution for activation accelerating treatment prior to electroless plating comprising sulfuric acid in a concentration of 0.01 to 5 mole/liter, cupric chloride in a concentration of 0.00003 to 0.03 mole/liter and an organic acid in a concentration of 5 mole/liter or less.

3. An aqueous solution according to claim 2, wherein the organic acid is at least one member selected from the group consisting of citric acid, glyceric acid, malonic acid, malic acid, glycolic acid, lactic acid, tartaric acid, and adipic acid.

* * * * *